(12) United States Patent
Hsieh et al.

(10) Patent No.: US 8,450,203 B2
(45) Date of Patent: May 28, 2013

(54) BUMPING PROCESS AND STRUCTURE THEREOF

(75) Inventors: Chin-Tang Hsieh, Kaohsiung (TW); Chih-Ming Kuo, Hsinchu County (TW)

(73) Assignee: Chipbond Technology Corporation, Hsinchu (TW)

( * ) Notice: Subject to any disclaimer, the term of this patent is extended or adjusted under 35 U.S.C. 154(b) by 181 days.

(21) Appl. No.: 13/187,353

(22) Filed: Jul. 20, 2011

(65) Prior Publication Data

US 2013/0022830 A1 Jan. 24, 2013

(51) Int. Cl.
*H01L 21/44* (2006.01)

(52) U.S. Cl.
USPC ........... 438/612; 438/613; 438/614; 257/737; 257/738

(58) Field of Classification Search
USPC ................. 438/612–614; 257/737–738, 770, 257/E23.021
See application file for complete search history.

(56) References Cited

U.S. PATENT DOCUMENTS 7,341,949 B2 * 3/2008 Chien et al. .................. 438/689
8,072,070 B2 * 12/2011 Lee et al. ...................... 257/737

* cited by examiner

*Primary Examiner* — Theresa T Doan
(74) *Attorney, Agent, or Firm* — Jackson IPG PLLC

(57) ABSTRACT

A bumping process comprises steps of forming a metal layer with copper on a substrate, and the metal layer with copper comprises a plurality of first zones and second zones; forming a photoresist layer on the metal layer with copper; patterning the photoresist layer to form a plurality of openings; forming a plurality of copper bumps within the openings, each of the copper bumps covers the first zones and comprises a first top surface; forming a connection layer on the first top surface; removing the photoresist layer; removing the second zones and enabling each of the first zones to form an under bump metallurgy layer, wherein the under bump metallurgy layer, the copper bump, and the connection layer possess their corresponded peripheral walls, and covering sections of a first protective layer formed on the connection layer may cover those peripheral walls to prevent ionization phenomenon.

9 Claims, 9 Drawing Sheets

BUMPING PROCESS AND STRUCTURE THEREOF

FIELD OF THE INVENTION

The present invention is generally relating to a bumping process, more particularly to the bumping process that prevents copper from ionization.

BACKGROUND OF THE INVENTION

With reference to FIGS. 1A to 1H, a conventional bumping process comprises the steps as followed, first, with reference to FIG. 1A, providing a substrate 10 having a surface 11, a plurality of bond pads 12 disposed on the surface 11, and a protective layer 13 formed on the surface 11, wherein the bond pads 12 are revealed by the protective layer 13; next, with reference to FIG. 1B, forming a metal layer with copper 20 on the bond pads 12 and the protective layer 13; then, with reference to FIG. 1C, forming a photoresist layer 30 on the metal layer with copper 20; afterward, with reference to FIG. 1D, patterning the photoresist layer 30 to form a plurality of openings 31; thereafter, with reference to FIG. 1E, forming a plurality of copper bumps 40 within the openings 31, and each of the copper bumps 40 comprises a first peripheral wall 41; after that, with reference to FIG. 1F, forming a connection layer 50 on the copper bumps 40; next, with reference to FIG. 1G, removing the photoresist layer 30; eventually, with reference to FIG. 1H, removing the metal layer with copper 20 which is not covered by the copper bumps 40 to form an under bump metallurgy layer 21 by using method of etching, and the under bump metallurgy layer 21 comprises a second peripheral wall 21a. However, when the process of "removing the metal layer with copper 20 which is not covered by the copper bump 40" is proceeding, the copper bumps 40 with material of copper may be etched as well thereafter leading an indentation of the first peripheral walls 41 of the copper bumps 40, and the indentation of the second peripheral walls 21a is severer than that of the first peripheral walls 41. Besides, for the reason that the first peripheral walls 41 and the second peripheral walls 21a are dented and exposed, an ionization phenomenon is easily occurred and leads a short condition.

SUMMARY

The primary object of the present invention is to provide a bumping process and comprises the steps of: providing a substrate having a surface and a plurality of bond pads disposed on the surface, and each of the bond pads has an exposed surface and a ring wall; forming a metal layer with copper on the substrate and covering the bond pads with the metal layer with copper, and the metal layer with copper comprises a plurality of first zones and a plurality of second zones; forming a photoresist layer on the metal layer with copper; patterning the photoresist layer to form a plurality of openings corresponded to the first zones; forming a plurality of copper bumps within the openings, and each of the copper bumps covers each of the first zones of the metal layer with copper and comprises a first top surface; forming a connection layer on the first surfaces of the copper bumps, the connection layer comprises a second top surface and includes a nickel layer and a coupling layer, wherein the nickel layer is located between the copper bump and the coupling layer; removing the photoresist layer; removing the second zones of the metal layer with copper and enabling each of the first zones of the metal layer with copper to form an under bump metallurgy layer, wherein each of the under bump metallurgy layers comprises a first peripheral wall, each of the copper bumps comprises a second peripheral wall, the connection layer comprises a third peripheral wall, a first distance is formed between the third peripheral wall and the second peripheral wall, and a second distance is formed between the third peripheral wall and the first peripheral wall; forming a first protective layer on the second top surface of the connection layer, the first peripheral walls of the under bump metallurgy layers, the second peripheral walls of the copper bumps, the third peripheral wall of the connection layer and the substrate, the first protective layer comprises a first covering section, a second covering section, a third covering section and a removing section, wherein the substrate is covered with the first covering section, the second covering section covers the first peripheral walls of the under bump metallurgy layers, the second peripheral walls of the copper bumps and the third peripheral wall of the connection layer, and the second top surface of the connection layer is covered with the third covering section and the removing section; forming a dielectric layer on the first protective layer; patterning the dielectric layer to form a plurality of exposed openings, and the removing section of the first protective layer is revealed by the exposed openings; and removing the removing section of the first protective layer to reveal the second top surface of the connection layer. Once the first peripheral walls of the under bump metallurgy layers and the second peripheral walls of the copper bumps are exposed, an ionization phenomenon is likely occurred and leads a short condition. Owing to the fact that the first protective layer covers the first peripheral walls of the under bump metallurgy layers, the second peripheral walls of the copper bumps and the third peripheral wall of the connection layer, the ionization phenomenon can be effectively prevented. Besides, for the reason that the first protective layer is covered by the dielectric layer, the thickness of the first protective layer can be thinner, and the dielectric layer may raise the structural strength of package and lower the amount of usage of sealing resin to eliminate water vapor.

DETAILED DESCRIPTION OF THE INVENTION

Figure 1A:
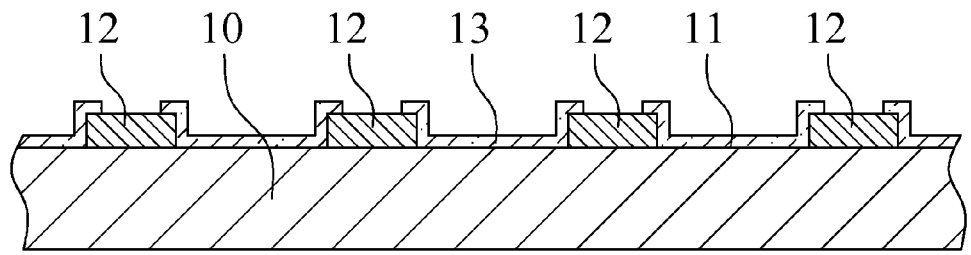
FIGS. 1A to 1H are cross-sectional views of conventional bumping process.
Figure 1B:
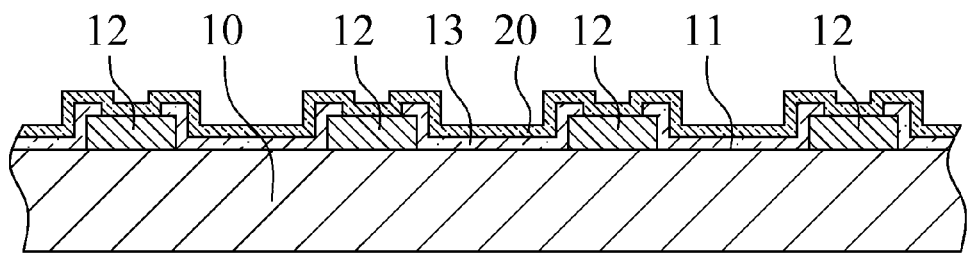
Figure 1C:
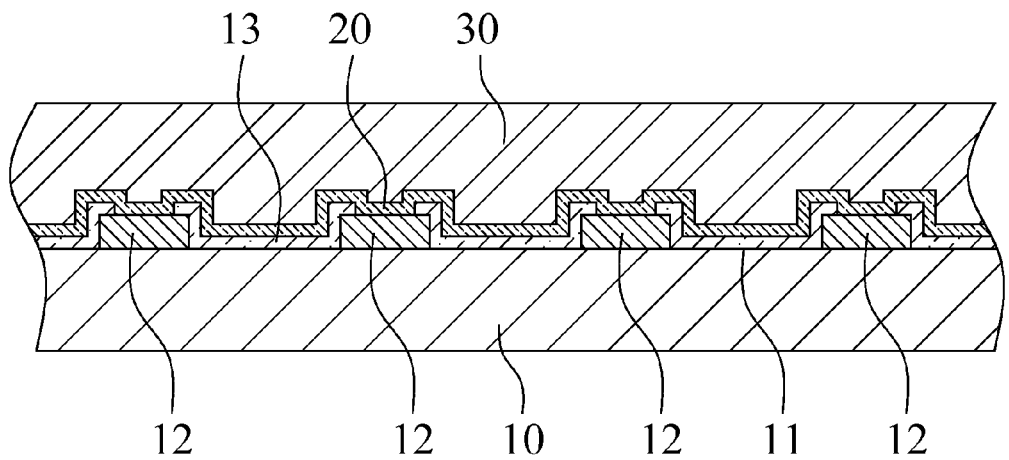
Figure 1D:
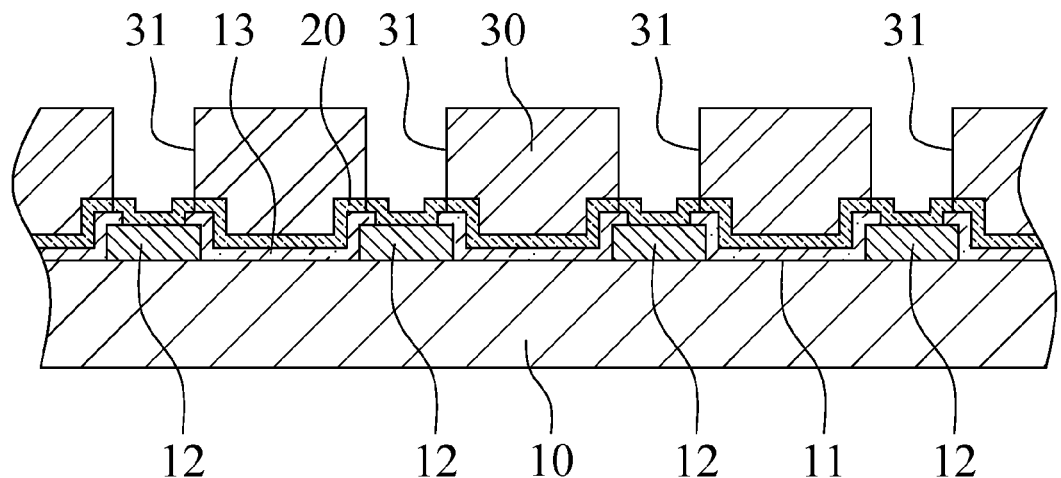
Figure 1E:
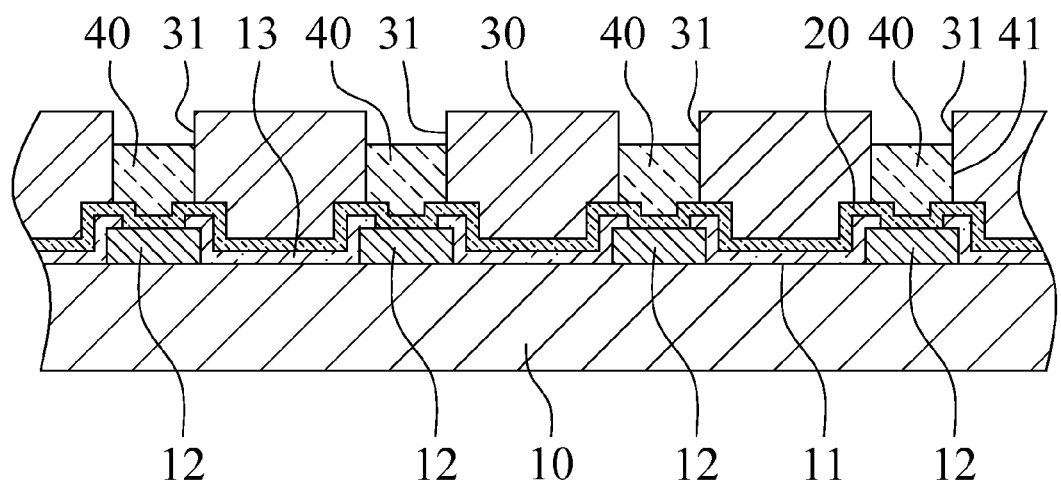
Figure 1F:
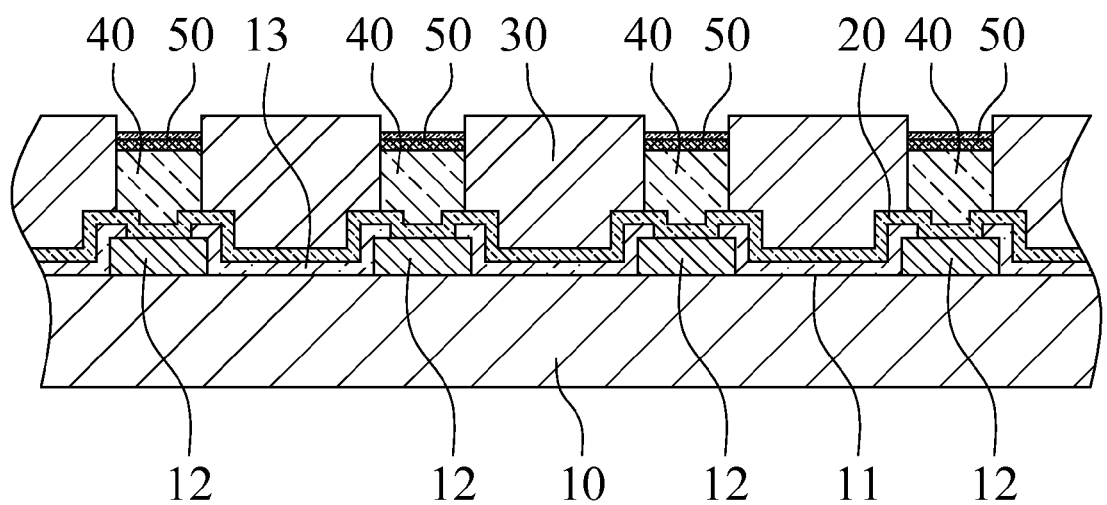
Figure 1G:
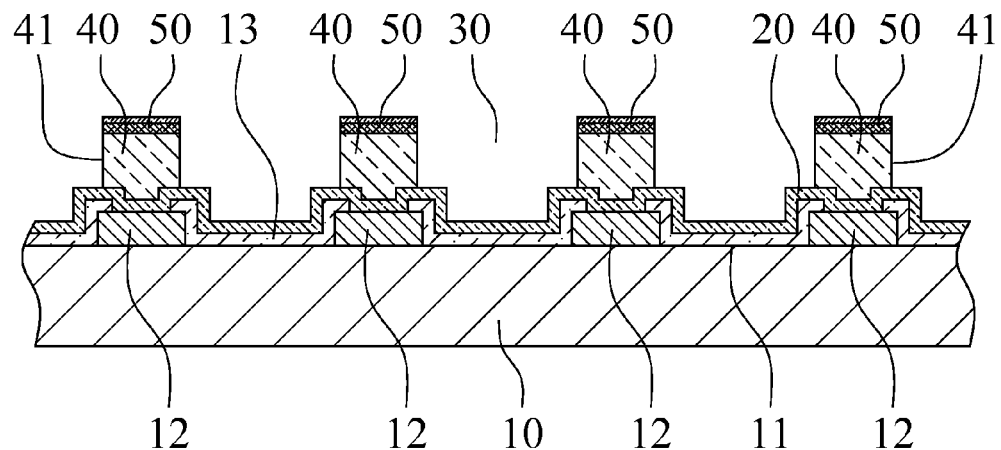
Figure 1H:
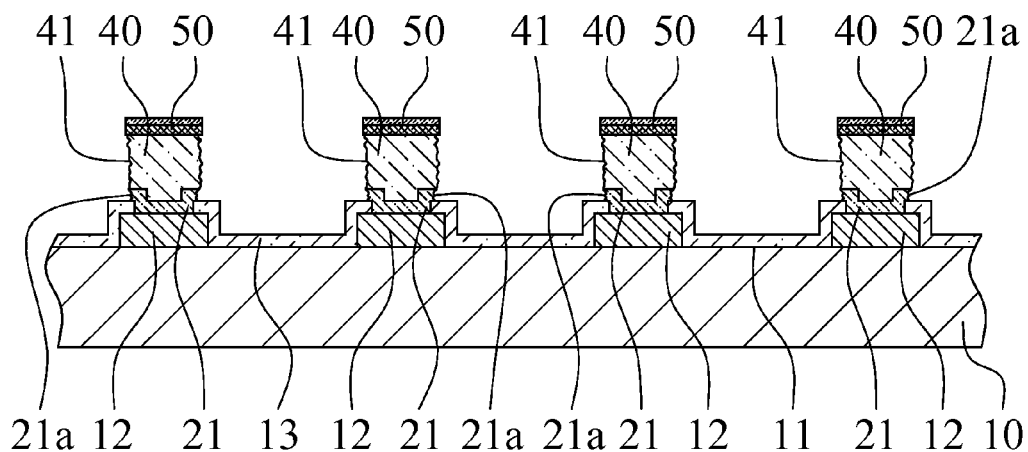
Figure 2A:
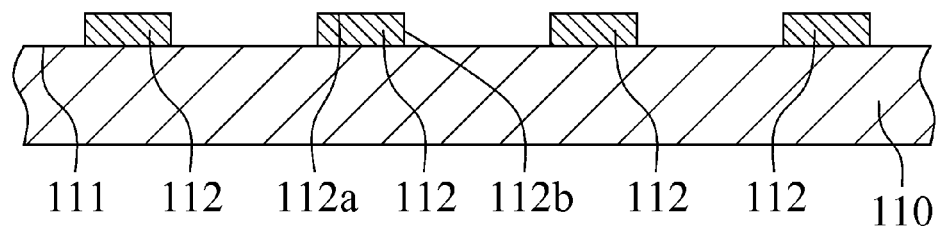
FIGS. 2A to 2L are cross-sectional views illustrating a bumping process with a preferred embodiment of the present invention.
Figure 2B:
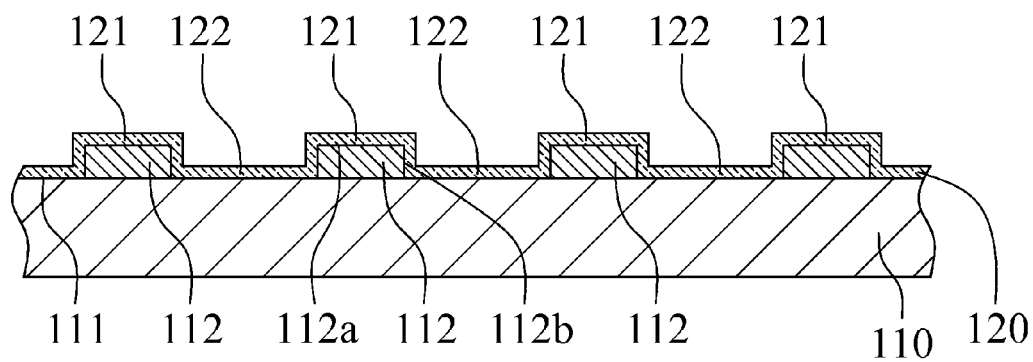
Figure 2C:
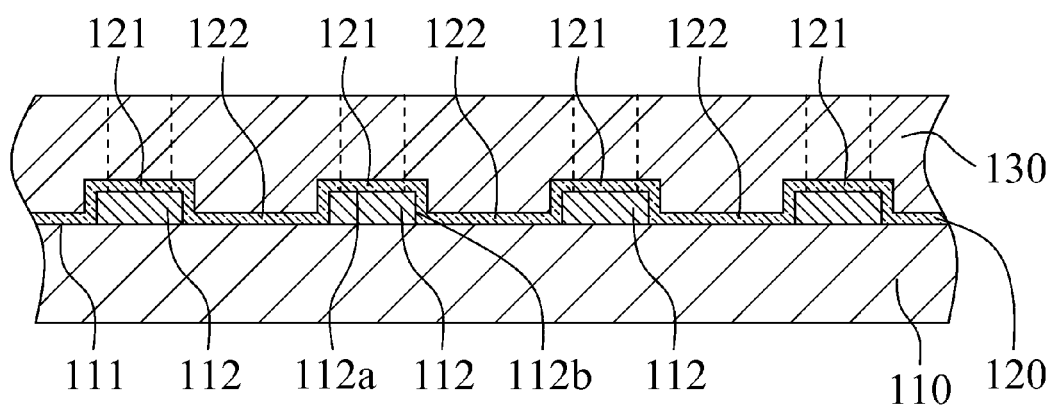
Figure 2D:
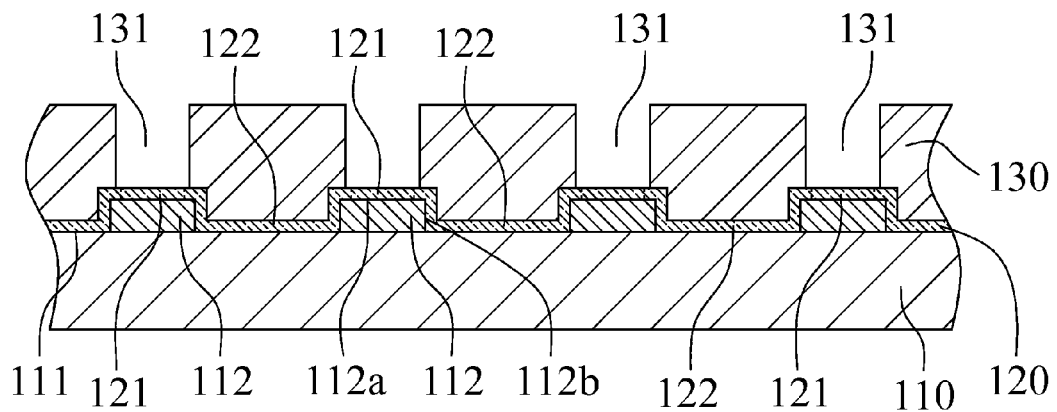
Figure 2E:
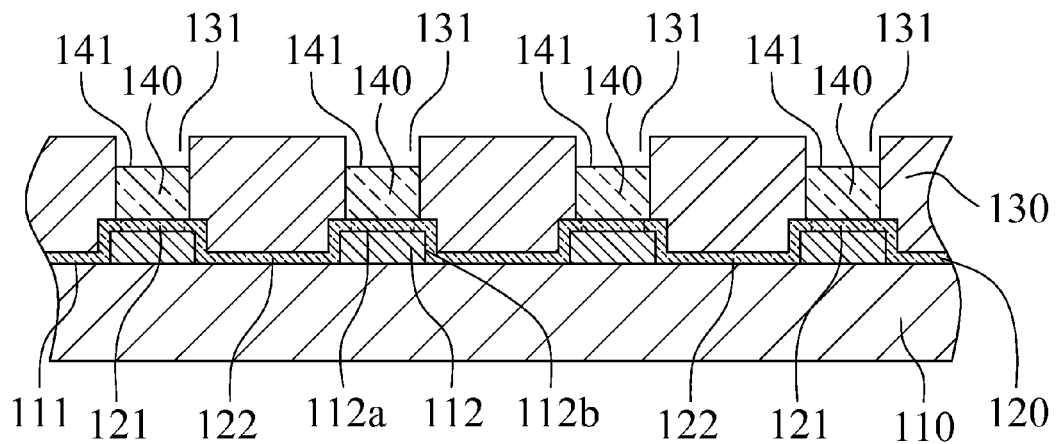
Figure 2F:
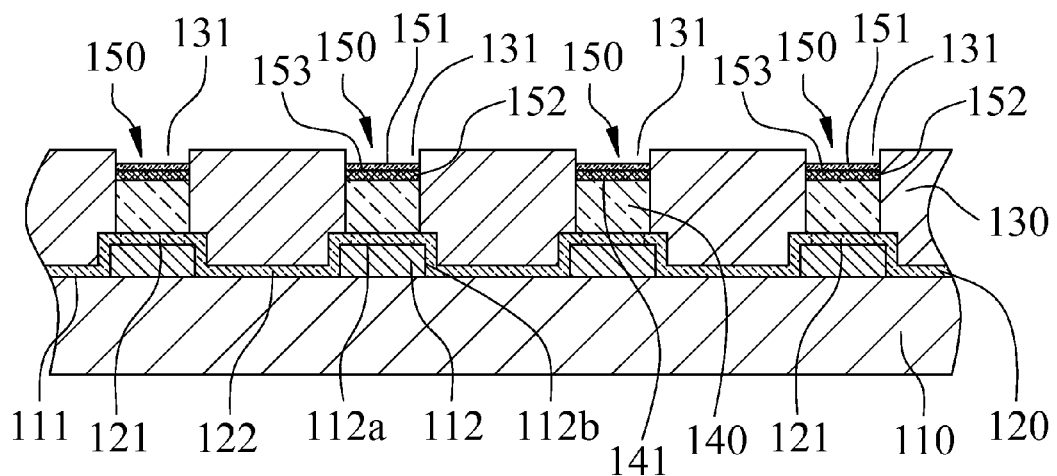
Figure 2G:
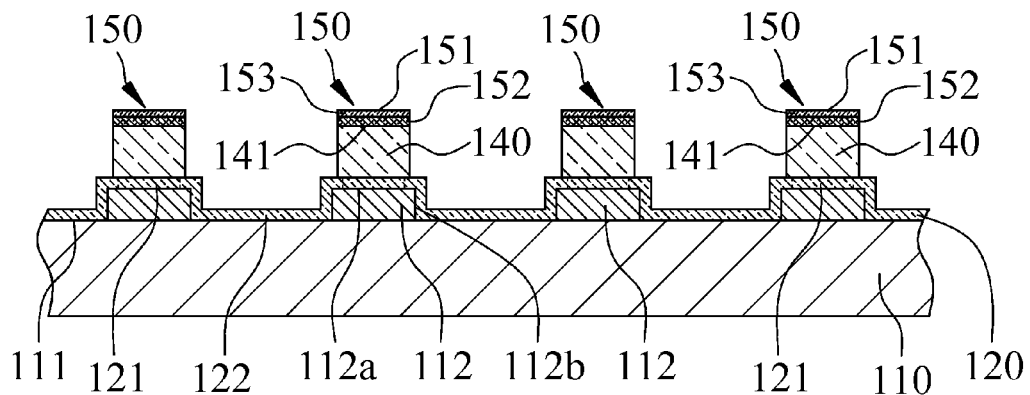
Figure 2H:
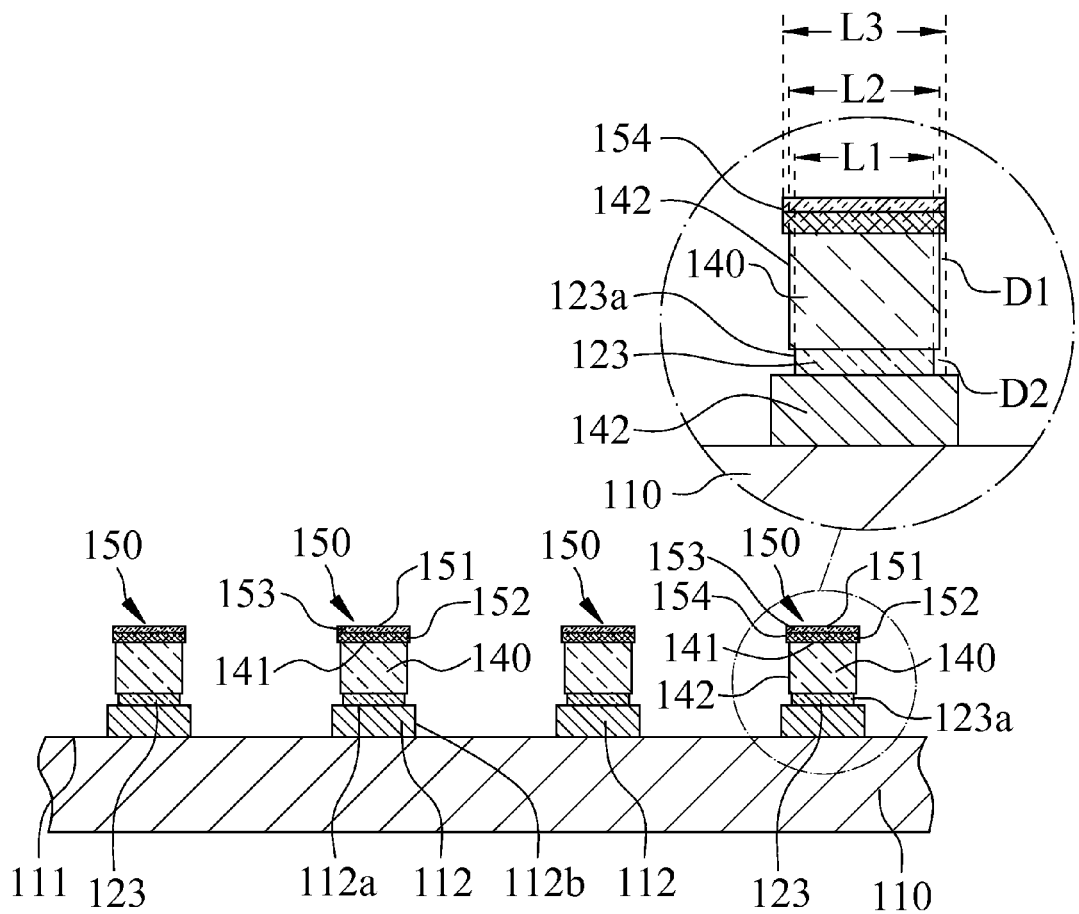
Figure 2I:
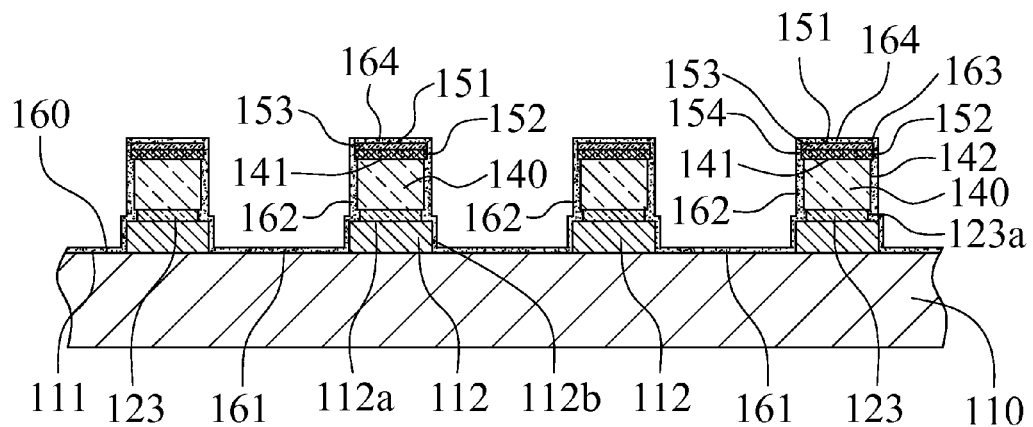
Figure 2J:
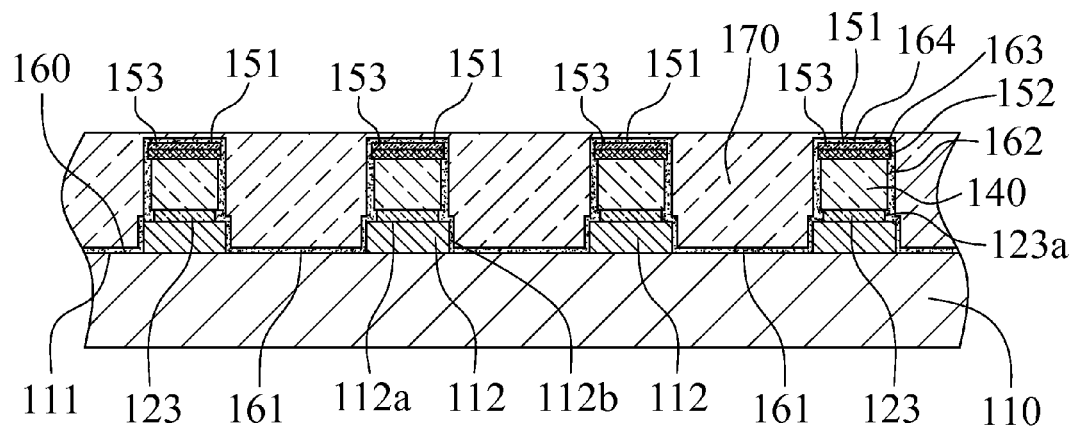
Figure 2K:
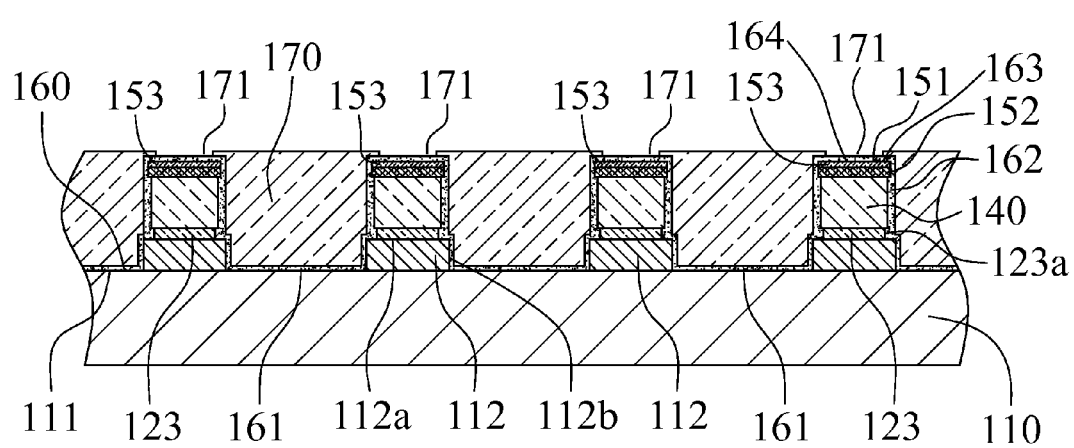
Figure 2L:
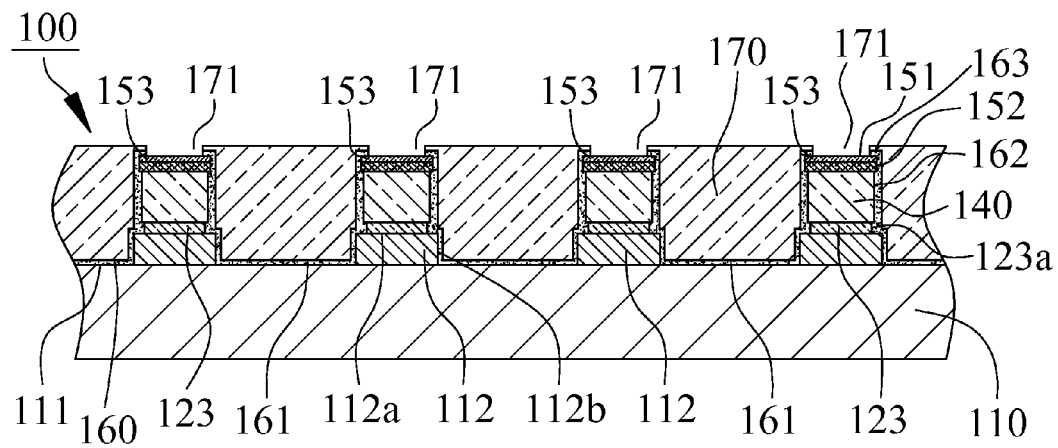

With reference to FIGS. 2A to 2L, a bumping process in accordance with a preferred embodiment of the present invention comprises the steps of: first, with reference to FIG. 2A, providing a substrate 110 having a surface 111 and a plurality of bond pads 112 disposed on the surface 111, and each of the bond pads 112 comprises an exposed surface 112a and a ring wall 112b; next, referring to FIG. 2B, forming a metal layer with copper 120 on the substrate 110 and covering the bond pads 112 with the metal layer with copper 120, in this embodiment, the metal layer with copper 120 covers the surface 111 of the substrate 110 and the bond pads 112, besides, the metal layer with copper 120 comprises a plurality of first zones 121 and a plurality of second zones 122; then, with reference to FIG. 2C, forming a photoresist layer 130 on the metal layer with copper 120; afterward, referring to FIG. 2D, patterning the photoresist layer 130 to form a plurality of openings 131 corresponded to the first zones 121; after that, with reference to FIG. 2E, forming a plurality of copper bumps 140 within the openings 131, each of the copper bumps 140 covers each of the first zones 121 of the metal layer with copper 120 and comprises a first top surface 141; thereafter, referring to FIG. 2F, forming a connection layer 150 on the first top surfaces 141 of the copper bumps 140, the connection layer 150 comprises a second top surface 151 and includes a nickel layer 152 and a coupling layer 153, wherein the nickel layer 152 is located between the copper bump 140 and the coupling layer 153; afterward, with reference to FIG. 2G, removing the photoresist layer 130; later, with reference to FIG. 2H, removing the second zones 122 of the metal layer with copper 120 and enabling each of the first zones 121 of the metal layer with copper 120 to form an under bump metallurgy layer 123, wherein each of the under bump metallurgy layer 123 comprises a first peripheral wall 123a, each of the copper bumps 140 comprises a second peripheral wall 142, the connection layer 150 comprises a third peripheral wall 154, a first distance D1 is formed between the third peripheral wall 154 and the second peripheral wall 142, a second distance D2 is formed between the third peripheral wall 154 and the first peripheral wall 123a, in this embodiment, the second distance D2 is not smaller than the first distance D1, the first peripheral wall 123a comprises a first circumference L1, the second peripheral wall 142 comprises a second circumference L2, the third peripheral wall 154 comprises a third circumference L3, the third circumference L3 is larger than the second circumference L2, and the second circumference L2 is not smaller than the first circumference L1; next, with reference to FIG. 2I, forming a first protective layer 160 on the second top surface 151 of the connection layer 150, the first peripheral walls 123a of the under bump metallurgy layers 123, the second peripheral walls 142 of the copper bumps 140, the third peripheral wall 154 of the connection layer 150 and the substrate 110, in this embodiment, the first protective layer 160 covers the surface 111 of the substrate 110 and the bond pads 112, besides, the first protective layer 160 comprises a first covering section 161, a second covering section 162, a third covering section 163 and a removing section 164, wherein the substrate 110 is covered by the first covering section 161, the second covering section 162 covers the first peripheral walls 123a of the under bump metallurgy layers 123, the second peripheral walls 142 of the copper bumps 140 and the third peripheral wall 154 of the connection layer 150, the second top surface 151 of the connection layer 150 is covered with the third covering section 163 and the removing section 164, in this embodiment, the ring wall 112b of the bond pad 112 and the surface 111 of the substrate 110 are covered with the first covering section 161, the material of the first protective layer 160 can be selected from one of oxide and nitride, oxide can be one of silicon nitride, silicon oxynitride and a combination of silicon nitride and silicon oxynitride, and nitride can be one of silicon dioxide, silicon oxynitride, and a combination of silicon nitride and silicon oxynitride; then, with reference to FIG. 2J, forming a dielectric layer 170 on the first protective layer 160, the material of the dielectric layer 170 can be selected from one of polyimides and benzocyclobutene; afterward, referring to FIG. 2K, patterning the dielectric layer 170 to form a plurality of exposed openings 171, and the removing section 164 of the first protective layer 160 is revealed by the exposed openings 171; eventually, referring to FIG. 2L, removing the removing section 164 of the first protective layer 160 to reveal the second top surface 151 of the connection layer 150 therefore forming a bump structure 100.

The bump structure 100 at least comprises a substrate 110, a plurality of under bump metallurgy layers 123, a plurality of copper bumps 140, a connection layer 150, a first protective layer 160 and a dielectric layer 170, wherein the substrate 110 comprises a surface 111 and a plurality of bond pads 112 disposed on the surface 111, each of the bond pads 112 comprises an exposed surface 112a and a ring wall 112b, the under bump metallurgy layers 123 are formed on the bond pads 112, each of the under bump metallurgy layers 123 comprises a first peripheral wall 123a, the copper bumps 140 are formed on the under bump metallurgy layers 123, each of the copper bumps 140 comprises a first top surface 141 and a second peripheral wall 142, the connection layer 150 is formed on the first top surfaces 141 of the copper bumps 140 and comprises a second top surface 151 and a third peripheral wall 154, besides, the connection layer 150 includes a nickel layer 152 and a coupling layer 153, wherein the nickel layer 152 is located between the copper bump 140 and the coupling layer 153, in this embodiment, the third peripheral wall 154 comprises a third circumference L3, the second peripheral wall 142 comprises a second circumference L2, the first peripheral wall 123a comprises a first circumference L1, the third circumference L3 is larger than the second circumference L2, the second circumference L2 is not smaller than the first circumference L1, wherein a first distance D1 is formed between the third peripheral wall 154 and the second peripheral wall 142, a second distance D2 is formed between the third peripheral wall 154 and the first peripheral wall 123a, the first protective layer 160 is formed on the first peripheral walls 123a of the under bump metallurgy layers 123, the second peripheral walls 142 of the copper bumps 140, the third peripheral wall 154 of the connection layer 150 and the substrate 110, the first protective layer 160 comprises a first covering section 161, a second covering section 162 and a third covering section 163, wherein the substrate 110 is covered with the first covering section 161, the second covering section 162 covers the first peripheral walls 123a of the under bump metallurgy layers 123, the second peripheral walls 142 of the copper bumps 140 and the third peripheral wall 154 of the connection layer 150, the second top surface 151 of the connection layer 150 is covered with the third covering section 163, the dielectric layer 170 is formed on the first protective layer 160 and comprises a plurality of exposed openings 171 to reveal the second top surface 151 of the connection layer 150. Once the first peripheral walls 123a of the under bump metallurgy layers 123 and the second peripheral walls 142 of the copper bumps 140 are exposed, an ionization phenomenon is likely occurred and leads a short condition. Owing to the fact that the first protective layer 160 covers the first peripheral walls 123a of the under bump metallurgy layers 123 and the second peripheral walls 142 of the copper bumps 140, the ionization phenomenon can be effectively prevented. Besides, for the reason that the bump structure 100 possesses the dielectric layer 170, a greater thickness of the first protective layer 160 is no longer needed, and the dielectric layer 170 may raise the structural strength of package and lower the amount of usage of sealing resin to eliminate water vapor.

Figure 3:
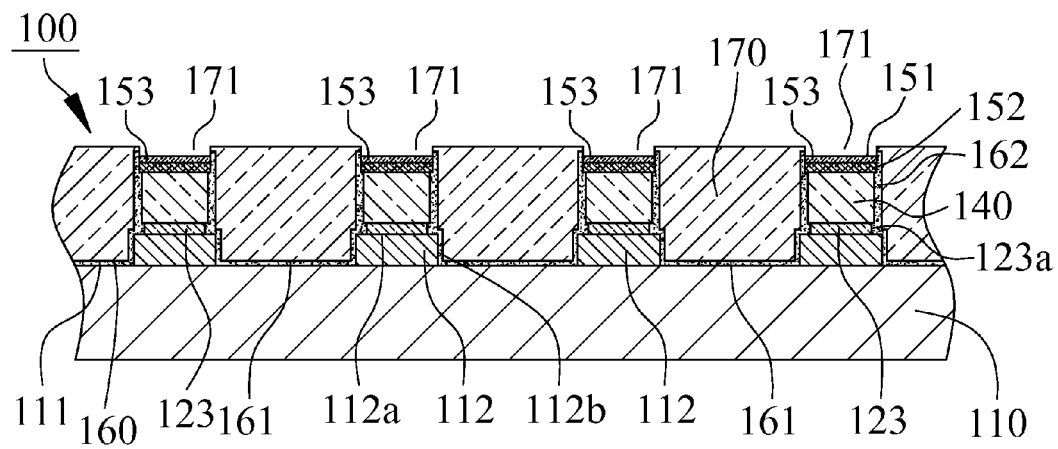
FIG. 3 is a cross-sectional view illustrating a bumping process in accordance with another embodiment of the present invention.

Or, with reference to FIG. 3, FIG. 3 represents a second embodiment of the present invention, the difference between the second and the first embodiment is that mentioned step "removing the removing section 164 of the first protective layer 160" may also remove the third covering section 163 to reveal a greater area of the second top surface 151.

Figure 4:
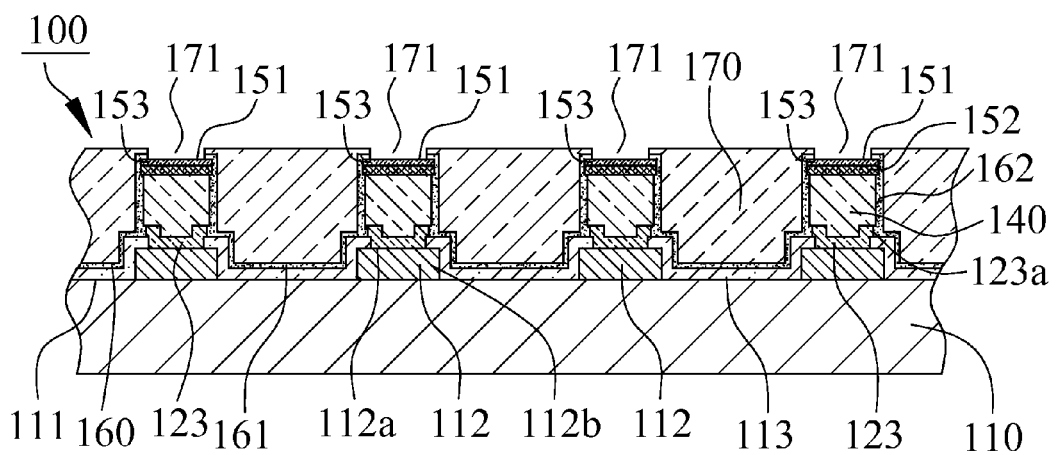
FIG. 4 is a cross-sectional view illustrating a bumping process in accordance with another embodiment of the present invention.

Or, with reference to FIG. 4, FIG. 4 represents a third embodiment of the present invention, the difference between the third and the first embodiment is that the substrate 110 further comprises a second protective layer 113, the second protective layer 113 is formed on the surface 111 and covers the bond pad 112. Therefore, the first protective layer 160 covers the second top surface 151 of the connection layer 150, the first peripheral walls 123a of the under bump metallurgy layers 123, the second peripheral walls 142 of the copper bumps 140, the third peripheral wall 154 of the connection layer 150 and the second protective layer 113, in this embodiment, the second protective layer 113 of the substrate 110 is covered with the first covering section 161 of the first protective layer 160, the second covering section 162 covers the first peripheral walls 123a of the under bump metallurgy layers 123, the second peripheral walls 142 of the copper bumps 140 and the third peripheral wall 154 of the connection layer 150, and the second top surface 151 of the connection layer 150 is covered with the third covering section 163.

While this invention has been particularly illustrated and described in detail with respect to the preferred embodiments thereof, it will be clearly understood by those skilled in the art that it is not limited to the specific features and describes and various modifications and changes in form and details may be made without departing from the spirit and scope of this invention.

What is claimed is:

1. A bumping process comprises the steps of:
    providing a substrate having a surface and a plurality of bond pads disposed on the surface, and each of the bond pads comprises an exposing surface and a ring wall;
    forming a metal layer with copper on the substrate and covering the bond pads with the metal layer with copper, and the metal layer with copper comprises a plurality of first zones and a plurality of second zones;
    forming a photoresist layer on the metal layer with copper;
    patterning the photoresist layer to form a plurality of openings corresponded to the first zones;
    forming a plurality of copper bumps within the openings, each of the copper bumps covers each of the first zones of the metal layer with copper and comprises a first top surface;
    forming a connection layer on the first top surfaces of the copper bumps, the connection layer comprises a second top surface and includes a nickel layer and a coupling layer, wherein the nickel layer is located between the copper bump and the coupling layer;
    removing the photoresist layer;
    removing the second zones of the metal layer with copper and enabling each of the first zones of the metal layer with copper to form an under bump metallurgy layer, wherein each of the under bump metallurgy layers comprises a first peripheral wall, each of the copper bumps comprises a second peripheral wall, the connection layer comprises a third peripheral wall, a first distance is formed between the third peripheral wall and the second peripheral wall, and a second distance is formed between the third peripheral wall and the first peripheral wall;
    forming a first protective layer on the second top surface of the connection layer, the first peripheral walls of the under bump metallurgy layers, the second peripheral walls of the copper bumps, the third peripheral wall of the connection layer and the substrate, the first protective layer comprises a first covering section, a second covering section, a third covering section and a removing section, wherein the substrate is covered with the first covering section, the first peripheral walls of the under bump metallurgy layers, the second peripheral walls of the copper bumps and the third peripheral wall of the connection layer are covered with the second covering section, and the second top surface of the connection layer is covered with the third covering section and the removing section;
    forming a dielectric layer on the first protective layer;
    patterning the dielectric layer to form a plurality of exposed openings, and the removing section of the first protective layer is revealed by the exposed openings; and
    removing the removing section of the first protective layer to reveal the second top surface of the connection layer.

2. The bumping process in accordance with claim 1 further comprises a step of removing the third covering section of the first protective layer.

3. The bumping process in accordance with claim 1, wherein the substrate further comprises a second protective layer, and the second protective layer is formed on the surface and covers the bond pads.

4. The bumping process in accordance with claim 3, wherein the second protective layer of the substrate is covered with the first covering section.

5. The bumping process in accordance with claim 1, wherein the ring wall of the bond pad and the surface of the substrate are covered with the first covering section.

6. The bumping process in accordance with claim 1, wherein the second distance is not smaller than the first distance.

7. The bumping process in accordance with claim 1, wherein the material of the first protective layer can be selected from one of oxide and nitride.

8. The bumping process in accordance with claim 7, wherein oxide can be one of silicon nitride, silicon oxynitride and a combination of silicon nitride and silicon oxynitride, and nitride can be one of silicon dioxide, silicon oxynitride and a combination of silicon nitride and silicon oxynitride.

9. The bumping process in accordance with claim 1, wherein the material of the dielectric layer can be selected from one of polyimides and benzocyclobutene.

* * * * *